United States Patent
Felgueroso

(10) Patent No.: US 7,419,408 B2
(45) Date of Patent: Sep. 2, 2008

(54) STAMPED GRID COMPRISING A FASTENING ELEMENT

(75) Inventor: Inigo Felgueroso, Buehl (DE)

(73) Assignee: Robert Bosch GmbH, Stuttgart (DE)

( * ) Notice: Subject to any disclaimer, the term of this patent is extended or adjusted under 35 U.S.C. 154(b) by 538 days.

(21) Appl. No.: 10/433,082

(22) PCT Filed: Nov. 24, 2001

(86) PCT No.: PCT/DE01/04434

§ 371 (c)(1),
(2), (4) Date: Feb. 18, 2004

(87) PCT Pub. No.: WO02/45471

PCT Pub. Date: Jun. 6, 2002

(65) Prior Publication Data

US 2004/0219844 A1 Nov. 4, 2004

(30) Foreign Application Priority Data

Nov. 30, 2000 (DE) .................. 100 59 419

(51) Int. Cl.
*H01R 13/40* (2006.01)
(52) U.S. Cl. ................................ 439/733.1
(58) Field of Classification Search ........... 439/733.1, 439/751, 746, 441
See application file for complete search history.

(56) References Cited

U.S. PATENT DOCUMENTS

| 4,781,608 | A | * | 11/1988 | Hillmann ............... 439/212 |
| 5,127,440 | A | | 7/1992 | Maas et al. |
| 5,821,663 | A | | 10/1998 | Kiehnle et al. |
| 5,876,237 | A | * | 3/1999 | Patel et al. ............ 439/441 |
| 6,049,043 | A | | 4/2000 | Tonejc |

FOREIGN PATENT DOCUMENTS

| DE | 44 30 798 A1 | 3/1996 |
| DE | 196 29 643 A1 | 1/1998 |
| DE | 100 07 263 A1 | 8/2000 |
| DE | 199 22 819 A1 | 11/2000 |
| FR | 2 667 202 A2 | 3/1992 |
| JP | 63-35261 | 2/1988 |
| JP | 1-146717 | 6/1989 |
| JP | 2000-299911 | 10/2000 |

* cited by examiner

*Primary Examiner*—Javaid Nasri
(74) *Attorney, Agent, or Firm*—Ronald E. Greigg

(57) ABSTRACT

A stamped screen according to the invention has at least one fastening element integral with the screen and is fastened to the associated component without further accessories at the same time as it is inserted into place.

16 Claims, 1 Drawing Sheet

STAMPED GRID COMPRISING A FASTENING ELEMENT

CROSS-REFERENCE TO RELATED APPLICATIONS

This application is a 35 USC 371 application of PCT/DE 01/04434 filed on Nov. 24, 2001.

BACKGROUND OF THE INVENTION

1. Field of the Invention

The invention is directed to a stamped screen for an electrical circuit, having improved fastening means integral with the screen.

2. Description of the Prior Art

DE 198 58 231 A1 has disclosed a stamped screen, which is inserted into a housing cover and is fastened to the housing cover by means of ultrasonic welding or warm caulking of positioning pins provided for this purpose. This means that in addition to inserting the stamped screen into the housing cover, another manufacturing step is required, namely the ultrasonic welding or the warm caulking and the devices required for them.

SUMMARY OF THE INVENTION

The stamped screen with the fastening element according to the invention has the advantage over the prior art that the stamped screen is simply fastened to a component in the same manufacturing step as being inserted into place.

An advantageous embodiment of the fastening of the fastening element in the component is achieved if the fastening element produces a frictional engagement with the component.

In order to advantageously achieve a frictional engagement between the fastening element and the component, the fastening element has a spring action, for example due to the fact that at least part of the stamped screen has a U-shaped cross section.

If the fastening element is of one piece with the stamped screen, then the stamped screen and fastening element can be advantageously produced in one step.

BRIEF DESCRIPTION OF THE DRAWINGS

An exemplary embodiment of the invention will be described herein below, in conjunction with the drawings, in which.

DESCRIPTION OF THE PREFERRED EMBODIMENT

Figure 1C:
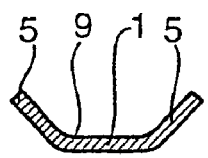
FIG. 1c shows the stamped screen according to the invention when not installed.
Figure 1B:
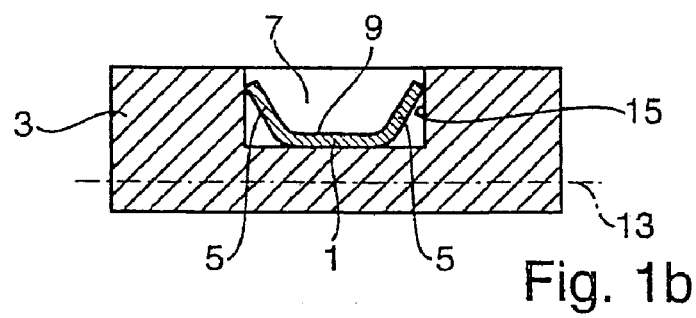
FIGS. 1a & b show a stamped screen according to the invention when installed.
Figure 1A:
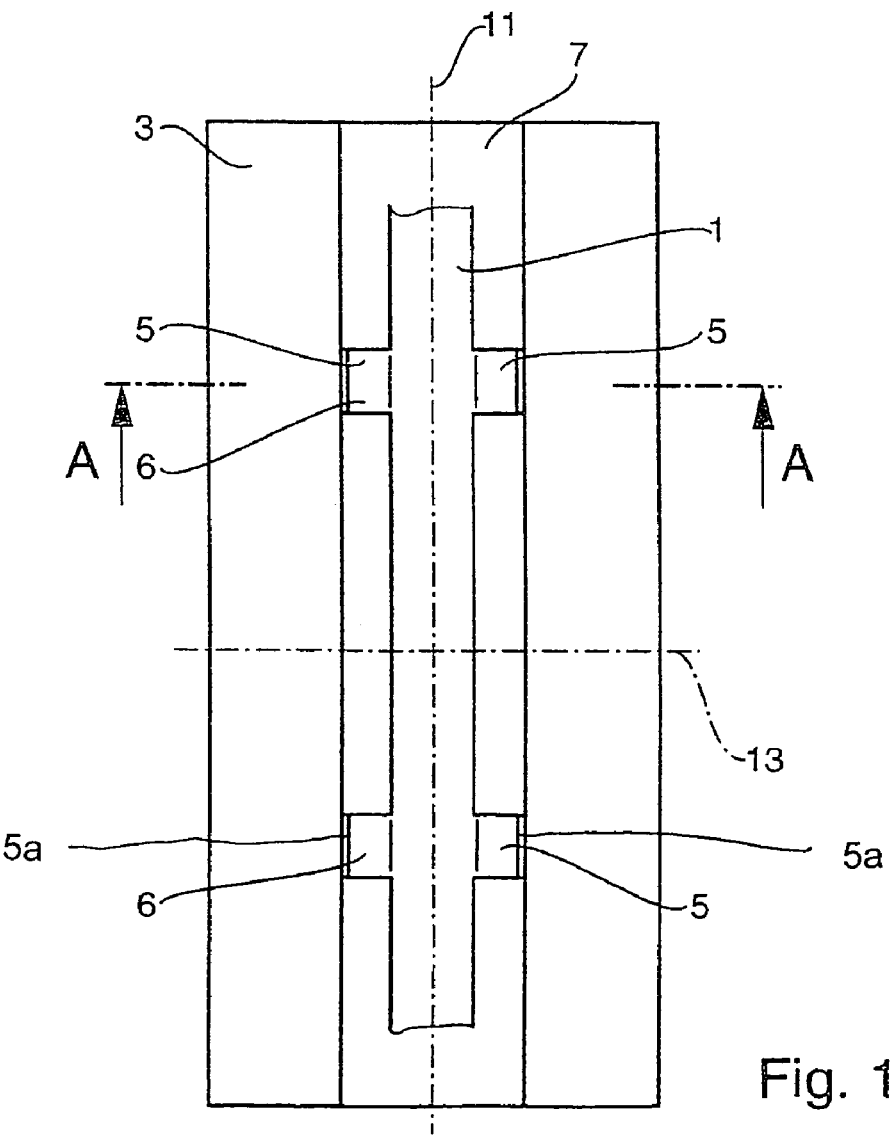

FIG. 1a shows a top view of a part of a stamped screen 1 according to the invention.

The stamped screen 1 is fastened to a component 3. The fastening is produced by virtue of the fact that the stamped screen 1 has at least one fastening element 5, which is, for example, of one piece with the stamped screen 1.

The fastening element 5 can, for example, be embodied in the form of a pin and/or hook so that upon installation of the stamped screen 1 into the component 3, the hook bites into the component 3 and thus fastens the stamped screen 1 to the component 3.

However, the fastening element 5 can also, as in this exemplary embodiment, produce a frictional engagement with the component 3.

In this connection, the fastening element 5 has a spring action. The spring action can act in numerous ways.

For example, the stamped screen 1 is at least partially embodied as straight in a longitudinal direction 11 and, as a fastening element 5, has at least one strip 6, which extends crosswise, e.g. perpendicular, to the longitudinal direction 11 of the stamped screen 1, in a lateral direction 13, beyond both longitudinal sides of the stamped screen 1. A tip end 5a of the fastening element extends past the sides of the stamped screen to form the crosswise strip 6.

FIG. 1b depicts the spring action of the strip 6 in a section along the line A-A. Part of the stamped screen 1 in the region of the strip 6 has a cross section in a U-shape 9, which produces a frictional engagement with the walls 15 of a recess 7 in the component 3.

When the fastening element 5 is not installed, which is depicted in FIG. 1c, the cross section 13 of the U-shape 9 is larger than the width of the recess 7. The U-shape 9 must therefore be compressed when the stamped screen 1 with the fastening element 5 is inserted into the recess 7. When the stamped screen 1 is then disposed in the recess 7, a spring action of the stamped screen 1 causes the fastening elements 5 to press against side walls 15 of the recess 7 and thus to produce a frictional engagement or biting action between the fastening element 5 and the recess 7.

The recess 7 can also have projections or detents in the lateral direction on the side walls 15 so that the U-shape snaps into the recess 7.

In this exemplary embodiment, the stamped screen 1 has a U-shape 9 in two places. However, it is also conceivable for the U-shape 9 to extend over a longer segment, i.e. for a U-shape 9 to be embodied, for example, between the upper fastening elements and the lower fastening elements in FIG. 1a, i.e. for a U-shaped channel to be embodied on the stamped screen 1.

For example, the stamped screen 1 is part of an electrical circuit of an electric machine. Then for example, the component 3 is a part of a housing of an electric machine or an electric drive unit.

The foregoing relates to preferred exemplary embodiments of the invention, it being understood that other variants and embodiments thereof are possible within the spirit and scope of the invention, the latter being defined by the appended claims.

The invention claimed is:

1. A fastening device with a stamped screen for an electrical circuit, which is fastened to a component, the stamped screen (1) having a longitudinal length, the stamped screen comprising at least one fastening element (5) that is of one piece with the stamped screen (1), the at least one fastening element having a tip end (5a) including means providing a spring action producing a frictional engagement between the tip end of the fastening element and the component (3), wherein the fastening element (5) extends perpendicularly to the longitudinal length of the stamped screen (1) such that the tip end (5a) of the fastening element (5) extends in a lateral direction beyond at least one longitudinal side of the stamped screen (1).

2. The stamped screen according to claim 1, wherein the component (3) comprises a recess (7), and wherein the stamped screen (1) is disposed in the recess (7) and the at least one fastening element produces a frictional engagement with the walls (15) of the recess (7).

3. The stamped screen according to claim 2, wherein the stamped screen (1) has a U-shape (9) cross-section through the at least one fastening element, which when the fastening element (5) is not installed, the U-shape cross-section has a width greater than the width of the recess (7).

4. The stamped screen according to claim 3, wherein the stamped screen (1) is part of an electrical circuit of an electric machine.

5. The stamped screen according to claim 3, wherein the component (3) is part of a housing of an electric machine or an electric drive unit.

6. The stamped screen according to claim 2, wherein the stamped screen (1) is part of an electrical circuit of an electric machine.

7. The stamped screen according to claim 2, wherein the component (3) is part of a housing of an electric machine or an electric drive unit.

8. The stamped screen according to claim 1, wherein the stamped screen (1) has a U-shape (9) cross-section through the at least one fastening element, which when the fastening element (5) is not installed, the U-shape cross-section has a width greater than the width of the recess (7).

9. The stamped screen according to claim 8, wherein the stamped screen (1) is part of an electrical circuit of an electric machine.

10. The stamped screen according to claim 8, wherein the component (3) is part of a housing of an electric machine or an electric drive unit.

11. The stamped screen according to claim 1, wherein the stamped screen (1) is part of an electrical circuit of an electric machine.

12. The stamped screen according to claim 11, wherein the component (3) is part of a housing of an electric machine or an electric drive unit.

13. A fastening device with a stamped screen for an electrical circuit, which is fastened to a component, the stamped screen (1) having a longitudinal length, the stamped screen comprising at least one fastening element (5) that is of one piece with the stamped screen (1), the at least one fastening element having a tip end (5a) including means providing a spring action producing a frictional engagement between the tip end of the fastening element and the component (3), wherein the fastening element (5) extends perpendicularly to the longitudinal length of the stamped screen (1) such that the tip end (5a) of the fastening element (5) extends in a lateral direction beyond at least one longitudinal side of the stamped screen (1), and wherein the component (3) is part of a housing of an electric machine or an electric drive unit.

14. The stamped screen according to claim 13, wherein the component (3) comprises a recess (7), and wherein the stamped screen (1) is disposed in the recess (7) and the at least one fastening element produces a frictional engagement with the walls (15) of the recess (7).

15. The stamped screen according to claim 13, wherein the stamped screen (1) has a U-shape (9) cross-section through the at least one fastening element, which when the fastening element (5) is not installed, the U-shape cross-section has a width greater than the width of the recess (7).

16. The stamped screen according to claim 13, wherein the stamped screen (1) is part of an electrical circuit of an electric machine.

\* \* \* \* \*